United States Patent [19]

Kolanko

[11] Patent Number: 5,034,705
[45] Date of Patent: Jul. 23, 1991

[54] POWER UP AND OSCILLATOR CIRCUIT USING A SINGLE CAPACITOR

[75] Inventor: Frank J. Kolanko, Greenville, R.I.

[73] Assignee: Cherry Semiconductor Corporation, East Greenwich, R.I.

[21] Appl. No.: 530,815

[22] Filed: May 30, 1990

[51] Int. Cl.[5] .............................................. H03K 3/26
[52] U.S. Cl. ................................ 331/111; 331/108 C; 331/143
[58] Field of Search ..................... 331/108 C, 111, 143

[56] References Cited

U.S. PATENT DOCUMENTS 4,947,312  8/1990  Tsuruoka et al. ................ 331/111 X Primary Examiner—David Mis
Attorney, Agent, or Firm—Robert M. Asher

[57] ABSTRACT

A method for powering up an integrated circuit and circuit for implementing the method. A first charging current is used to slowly charge a capacitor used in the integrated circuit upon connecting the power. A power-up signal is provided to initialize digital circuitry until the first charging current raises the voltage of the capacitor above a threshold value. Once a capacitor is charged to another predetermined threshold, a second charging current is activated. The two charging currents are thereafter used as the total charging current on the capacitor. If the capacitor is grounded, the initial power-up scheme is re-initiated.

19 Claims, 2 Drawing Sheets

POWER UP AND OSCILLATOR CIRCUIT USING A SINGLE CAPACITOR

BACKGROUND OF THE INVENTION

Powering up digital integrated circuits by connecting the positive and negative terminals of a power supply to the circuit can cause multiple transient voltage waveforms to be applied to the circuit due to the mechanical nature of making the connection of the wires to the circuit. When the circuit is powered up it is often desirable for memory devices such as flip flops to be in a known state, i.e., $Q=1$ or $Q=0$, depending on the application. If the integrated circuit is powered up and then sequentially a transient is imposed by a clumsy mechanical connection of the two wires to the power supply then an undesirable signal may be sent through the digital circuitry disturbing the initial states.

This problem can be minimized through the use of filter capacitors to the supply line of the circuit. However, due to the charge time of the capacitors, this does not eliminate the problem. A large value of capacitance would provide a more stable DC level from the power supply to the integrated circuit but in many cases it is too costly to provide this additional large capacitor, or it may be impractical to allow for the time needed to charge up the large capacitor.

It is an object of the present invention to provide a power up circuit which extends the time for powering up by using an already existing capacitor, such as the timing capacitor in an oscillator.

SUMMARY OF THE INVENTION

The present invention is directed to a method for powering up digital circuitry and the method for implementing that method.

In accordance with the power up scheme of the present invention, a first charging current is applied to the timing capacitor of the oscillator. A second larger current is withheld from the timing capacitor until the first charging current has charged the capacitor to a first predetermined threshold. The timing capacitor charges and discharges between a peak voltage and a valley voltage. Initially, a power-up signal sets the digital circuitry in its initial states and is held on until the first charging current raises the voltage on the timing capacitor above a second predetermined threshold. After the initial power up and the first predetermined threshold is reached, charging is accomplished with the sum of the first and second charging currents.

The circuit for implementing the method of the present invention includes a timing capacitor and a source of the first charging current. A second charging current source is provided for use after the initial power up. A transistor is provided for diverting the current from the second charging current source to ground until after the first charging current has charged the timing capacitor to its predetermined threshold. Thereafter, both the first and second charging currents are used to charge the timing capacitor. A discharge transistor is turned on when a timing capacitor reaches its peak voltage and off when it drops to a valley voltage. In addition, the present circuit may be provided with a comparator which will reset the circuit into the power-up mode if the timing capacitor drops below a second predetermined threshold that is lower than the valley voltage.

By charging the timing capacitor initially with a first charging current, the power-up phase is advantageously lengthened so that any transients appearing on the power line will occur while the power-up signal is still being provided to the digital circuitry. This power-up scheme is advantageously achieved without the need for a capacitor in addition to the timing capacitor already required by the oscillator circuitry. A still further advantage of the present circuit is that the initial power-up phase can be reentered by grounding the timing capacitor.

DETAILED DESCRIPTION OF THE PREFERRED EMBODIMENT

Figure 1:
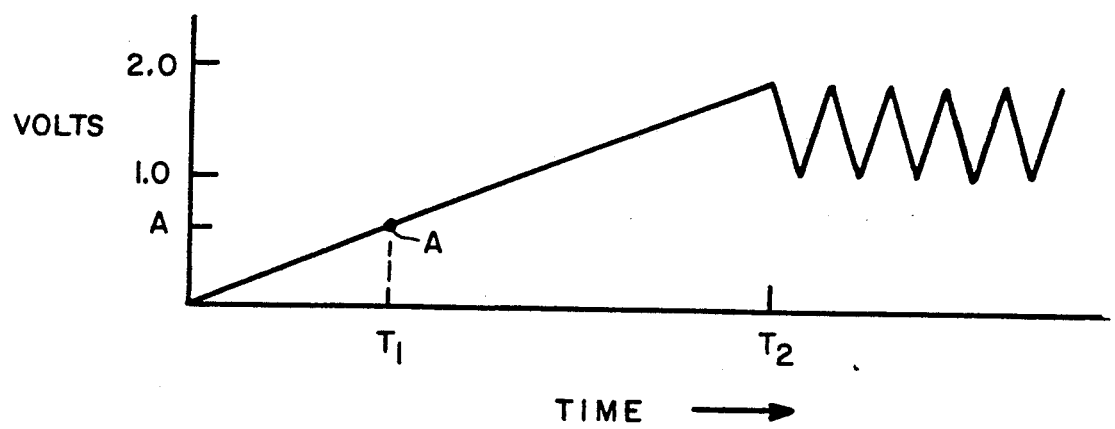
FIG. 1 is a graph of the voltage waveform produced by the first power up scheme of the present invention.

In accordance with the power up scheme of the present invention, when power is first applied to the circuit a first charging current is supplied to a capacitor already required by the integrated circuit. As shown in FIG. 1, from time 0 to time T2 the first charging current is the only current charging up the capacitor. At time T2, a predetermined voltage threshold has been reached on the capacitor. Thereafter, a second charging current is enabled for use in conjunction with the first charging current to charge the capacitor. Thus, the rate of charging is dramatically increased.

By limiting the initial charging current to the capacitor to that provided by the first charging current, a significant time delay is imposed before the circuit enters into normal operation. From the moment 0 when power is first applied, a power-up signal is provided to the digital circuitry in the integrated circuit. The power-up signal is maintained until the threshold reached at time $T_1$ is attained by the timing capacitor. Any transients caused from the attachment of the wires of power supply to the circuit which occur prior to the delay $T_1$ will have no adverse effect on the digital circuitry. The power-up signal remains available to immediately re-initialize the digital circuitry until time $T_1$.

In accordance with the present invention the power-up time delay is provided without use of an extra filter capacitor. A capacitor already used on the integrated circuit is employed. The predetermined threshold for activating the second charging current may be located anywhere between the power-up signal threshold A and the peak voltage of the oscillator circuit. In accordance with the presently preferred embodiment, the predetermined threshold for activating the second charging current is equal to the peak voltage of the oscillator circuit.

Figure 2:
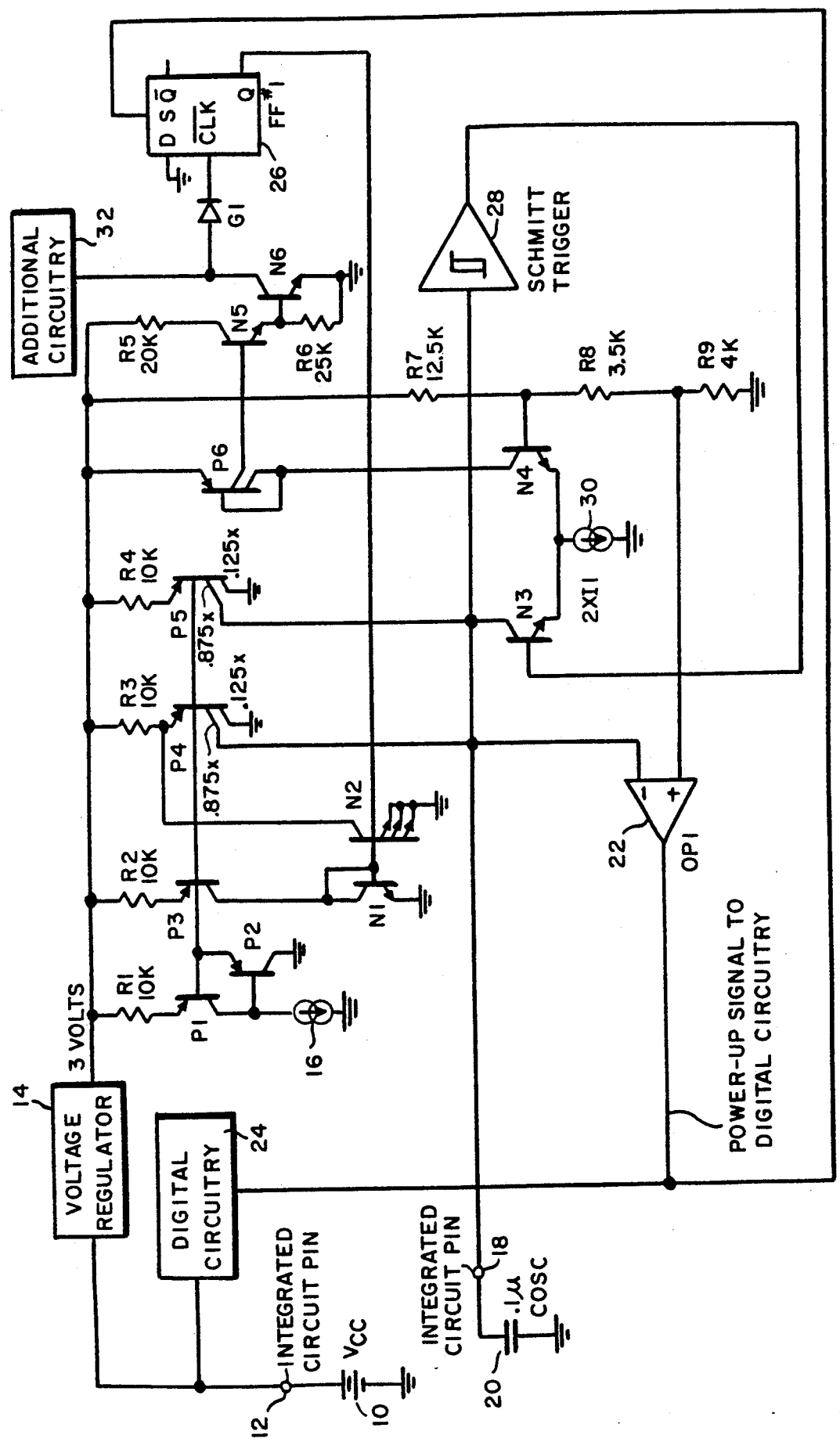
FIG. 2 is a schematic diagram of a circuit implementing the present invention.

Referring now to FIG. 2, a schematic diagram of the presently preferred embodiment is illustrated. A power supply 10 is connected to the integrated circuit at the Vcc pin 12. The integrated circuit includes a voltage regulator 14 which provides, in the presently preferred embodiment, a rail voltage of 3 volts. The power enables a current source 16 to produce a current I1. The current I1 is provided through a current mirror formed by resistor R1 and transistors P1 and P2 which are provided in a buffered configuration. The current I1 is mirrored through resistors R2, R3 and R4. Resistors R1, R2, R3 and R4 are all the same value to provide equal currents through each of these resistors.

The current mirror provided by resistor R4 and transistor P5 generates the first charging current for the power-up circuitry. Transistor P5 is a PNP transistor with a split collector. ⅞ or 0.875 of the collector is tied ground. ⅛ of the collector of 0.125 provides the first charging current to the circuitry. Thus, the first charging current is equal to ⅛ of the current I1 from current source 16. The first charging current is provided through the timing capacitor pin 18 to the timing capacitor 20.

The voltage on the timing capacitor 20 is monitored by an op amp 22 acting as a comparator. The voltage on the timing capacitor 20 is provided to the inverting input of the op amp 22. The non-inverting input of the op amp 22 is provided with a voltage at a predetermined threshold. In accordance with the presently preferred embodiment, this threshold is set at 0.6 volts by a voltage divider formed by resistors R7, R8 and R9. Op amp 22 provides a high power-up signal until the voltage on the timing capacitor 20 reaches the threshold set by the voltage divider. At that threshold, the output of the op amp 22 changes from high to low. The power-up signal initializes digital circuitry 24. The power-up signal is advantageously maintained while only the first charging current charges timing capacitor 20 to the 0.6 volt threshold.

The output of the op amp 22 is also provided to a flip flop 26. It is provided to the set input of the flip flop 26. The initial high signal puts the flip flop in the state Q=1. The high signal in the flip flop 26 is provided to the base of transistors N1 and N2. Transistor N1 is connected to the current mirror formed by transistor P3 and resistor R2 so that N1 receives the current I1 through its collector and base which are coupled together. Transistor N2 has its collector connected between resistor R3 and transistor P4. With a high output from the flip flop 26, transistor N2 is on so that it shunts or diverts the current I1 away from transistor P4. All the current going through resistor R3 is diverted through transistor N2 when the output of the flip flop 26 is high. Transistor P4 is provided for delivering a second charging current. The second charging current is not active while flip flop 26 is high and transistor N2 is on. The collector of transistor P4 is divided into two fractional parts with ⅛ of the collector being tied to ground and ⅞ of the collector being connected to the timing capacitor 20. The fractional portions of the collector in transistor P4 complements that of transistor P such that when both the first and second charging currents are being provided to the timing capacitor 20, the total charging current totals the current I1 provided by current source 16.

After the power-up signal is issued by the op amp 22, a low signal is provided to the set input of the flip flop 26. The low set signal does not change the output of the flip flop, thus the first charging current continues to charge up timing capacitor 20 by itself. The oscillator circuit used in the present embodiment employs a Schmitt trigger 28 which monitors the voltage on the timing capacitor 20. When the voltage on the timing capacitor 20 reaches its peak voltage, which is 2 volts in the illustrated embodiment, the Schmitt trigger 28 output goes high turning on the discharge transistor N3 and turning off transistor N4. The emitter of the discharge transistor N3 is connected to a current source 30 providing a current at twice the level of the current I1. During the discharging, the charging current sources provide a current equal to I1 while a current of twice I1 is pulled through transistor N3. Therefore, the timing capacitor 20 is then discharged through the transistor N3 with a current equal to I1.

When transistor N4 turns off, transistor P6 turns off. This in turn turns off transistors N5 and N6. With N6 off, the signal provided through inverter G1 to the flip flop 26 goes low feeding a clock signal pulse into the flip flop. When the flip flop 26 receives its first clock pulse, the flip flop changes state to match its D input. D is connected to ground. Thus, the output Q of the flip flop 26 goes low when the first clock pulse is received. This turns off the transistor N2 such that the current I1 is no longer diverted from the transistor P4. Thus, after the first clock pulse has been received by the flip flop 26, the second charging current is enabled. Thus, after the first peak, the charging current equals the total of the first and the second charging currents or I1. Thereafter, the timing capacitor will be charged and discharged with the current I1.

The lower trip point of the Schmitt trigger 28 or the valley voltage reached by the timing capacitor 20 is set higher than the threshold at the non-inverting input of the op amp 22. Thus, the output from the op amp 22 is prevented from going high again during normal operation. In accordance with the illustrated embodiment, the valley voltage is set to 1.4 volts. When the timing capacitor 20 drops to the valley voltage, the Schmitt trigger 28 goes low turning off transistor N3 and turning on transistor N4. With the discharge transistor turned off, the timing capacitor 20 charges up again via the charging currents from transistors P4 and P5. With transistor N4 turned on, P6 turns on which in turn turns on transistors N5 and N6. The collector of transistor N6 thus provides a clock signal for use by additional circuitry 32 in the integrated circuit. Clock signals will be repeatedly applied to the flip flop 26, however, the output will remain low since the D input is tied to ground.

The only time that the flip flop 26 will have its output changed to a high signal after the oscillator has entered normal operation is if the timing capacitor 20 were grounded. There may be applications in which it is desirable to provide such a resetting capability. If the integrated circuit pin 18 is grounded, once the inverting input to the op amp falls below the threshold set by the voltage divider, its output will go high. Its high signal will go to the digital circuitry 24 as a power-up signal to reinitialize the circuitry and to the set input of the flip flop 26 resetting the output of the flip flop to a high signal. This will turn on transistor N2 and divert the second charging current. Thus, the initial power up sequence is repeated upon grounding the timing capacitor pin 18.

Of course, it should be understood that various changes and modifications to the preferred embodiment described above will be apparent to those skilled in the art. For example, the thresholds may be changed, the peak voltage and threshold for turning on the second charging current may be separated, any of numerous oscillator circuits may be substituted for the one shown, the relative proportions between the first and second charging currents may be altered and other integrated circuits other than an oscillator circuit may be used in conjunction with the power-up scheme. These and other changes can be made without departing from the spirit and scope of the invention and without diminishing its attendant advantages. It is therefore intended that such changes and modifications be covered by the following claims.

I claim:

1. A method for powering up an integrated circuit comprising:
   providing a first charging current to a timing capacitor;
   providing a second charging current larger than said first charging current after said first charging current charges said timing capacitor to a first predetermined threshold;
   causing said timing capacitor to discharge when it reaches a peak voltage; and
   permitting said timing capacitor to charge with said first and second charging currents when said timing capacitor drops to a valley voltage.

2. The method of claim 1 wherein said peak voltage equals said first predetermined threshold.

3. The method of claim 1 further comprising the steps of providing a power-up signal when power is initially applied to said circuit and releasing said power-up signal when said first charging current charges said timing capacitor to a second predetermined threshold, said second predetermined threshold being lower than said valley voltage.

4. The method of claim 3 further comprising the step of grounding said timing capacitor and diverting said second charging current away from said timing capacitor until after said first charging current charges said timing capacitor to said first predetermined threshold.

5. A power up and oscillator circuit comprising:
   a timing capacitor;
   first means for providing a first charging current to said timing capacitor;
   second means for providing a second charging current to said timing capacitor;
   means for delaying activation of said second means until said first charging current charges said timing capacitor to a predetermined threshold;
   comparator means for causing said timing capacitor to discharge when it reaches a peak voltage and for causing said timing capacitor to charge when it drops to a valley voltage.

6. The circuit of claim 5 wherein said delaying means comprises a transistor for diverting said second charging current to ground and a flip flop for holding said transistor on until said first charging current charges said timing capacitor to the predetermined threshold.

7. The circuit of claim 6 further comprising a second comparator means for issuing a reset signal to said flip flop if said timing capacitor falls below a second predetermined threshold, said second predetermined threshold being lower than said valley voltage and said reset signal causing said flip flop to switch said transistor back on.

8. The circuit of claim 5 further comprising a second comparator means for issuing a power-up signal when power is initially applied to said circuit and for releasing said power-up signal when said first charging current charges said timing capacitor to a second predetermined threshold being lower than said valley voltage.

9. A power up and oscillator circuit comprising:
   a timing capacitor;
   first means for providing a first charging current to said timing capacitor;
   second means for providing a second charging current to said timing capacitor;
   a transistor for diverting said second charging current to ground;
   means for holding said transistor off after said first charging current charges said timing capacitor to a first predetermined threshold so that thereafter said timing capacitor is charged by the sum of said first and second charging currents; and
   means for discharging said timing capacitor after said timing capacitor reaches a peak voltage until said timing capacitor drops to a valley voltage.

10. The circuit of claim 9 further comprising a comparator which resets said holding means to switch said transistor back on when said timing capacitor drops below a second predetermined threshold lower than said valley voltage.

11. The circuit of claim 10 wherein said comparator provides a power-up signal for initializing digital circuitry until said timing capacitor rises above said second predetermined threshold.

12. The circuit of claim 9 wherein said discharging means comprises a transistor having an emitter connected to a current source with a current equal to twice the sum of said first and second charging currents.

13. The circuit of claim 9 wherein said holding means comprises a flip flop.

14. The circuit of claim 9 wherein said first predetermined threshold comprises said peak voltage.

15. A power up and oscillator circuit comprising:
    a current source;
    means for providing a first fraction of the current provided by said current source;
    a timing capacitor coupled to receive said first fraction of current;
    means for providing a second fraction of the current provided by said current source, said second fraction of current being larger than said first fraction of current;
    means for diverting said second fraction of current to ground;
    flip flop means for indefinitely shutting said diverting means off when said first charging current charges said timing capacitor to a peak voltage so that said second fraction of current is thereafter used in conjunction with said first fraction of current to charge said timing capacitor;
    means for discharging said timing capacitor; and
    means for switching said discharging means on when said timing capacitor is charged to the peak voltage and for switching said discharging means off when said timing capacitor drops to a valley voltage.

16. The circuit of claim 15 wherein said switching means comprises a Schmitt trigger.

17. The circuit of claim 15 wherein said discharging means comprises a transistor having an emitter connected to a current source which provides twice as much current as the sum of said first fraction of current and said second fraction of current.

18. The circuit of claim 15 further comprising a comparator for issuing a power-up signal until said timing capacitor is charged above a predetermined threshold, said predetermined threshold being lower than said valley voltage.

19. The circuit of claim 18 wherein said power-up signal is also connected to said flip flop means to act as a reset signal which switches said diverting means on.

* * * * *